US012677437B2

(12) United States Patent
Li et al.

(10) Patent No.: US 12,677,437 B2
(45) Date of Patent: Jul. 7, 2026

(54) SEMICONDUCTOR STRUCTURE WITH BLOCKING LAYER

(71) Applicant: Taiwan Semiconductor Manufacturing Company, Ltd., Hsinchu (TW)

(72) Inventors: Kun-Mu Li, Zhudong Township, Hsinchu County (TW); Wei-Yang Lee, Taipei City (TW); Wen-Chu Hsiao, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 510 days.

(21) Appl. No.: 18/080,934

(22) Filed: Dec. 14, 2022

(65) Prior Publication Data

US 2023/0113464 A1      Apr. 13, 2023

Related U.S. Application Data

(60) Continuation of application No. 17/119,529, filed on Dec. 11, 2020, now Pat. No. 11,532,749, which is a
(Continued)

(51) Int. Cl.
*H10D 30/62*        (2025.01)
*H10D 30/01*        (2025.01)
(Continued)

(52) U.S. Cl.
CPC ......... *H10D 30/62* (2025.01); *H10D 30/0212* (2025.01); *H10D 30/024* (2025.01);
(Continued)

(58) Field of Classification Search
CPC .. H10D 30/62; H10D 30/024; H10D 84/0158; H10D 84/834; H10D 84/853;
(Continued)

(56) References Cited

U.S. PATENT DOCUMENTS 8,772,109 B2    7/2014  Colinge
8,785,285 B2    7/2014  Tsai et al.
(Continued)

FOREIGN PATENT DOCUMENTS

KR      10-2018-0112897 A      4/2017

*Primary Examiner* — Aaron J Gray
(74) *Attorney, Agent, or Firm* — Birch, Stewart, Kolasch & Birch, LLP

(57) ABSTRACT

A semiconductor structure is provided. The semiconductor structure includes a gate structure over a fin structure, and a source/drain structure in the fin structure and adjacent to the gate structure. The source/drain structure includes: a first epitaxial layer over the fin structure, a second epitaxial layer over the first epitaxial layer, and an epitaxial capping layer over the second epitaxial layer. The semiconductor structure also includes a silicide layer formed in contact with the source/drain structure. The silicide layer has a curved bottom surface, and the curved bottom surface of the silicide layer intersects with the second epitaxial layer and the epitaxial capping layer.

20 Claims, 12 Drawing Sheets

Related U.S. Application Data division of application No. 16/101,897, filed on Aug. 13, 2018, now Pat. No. 10,868,181.

(60) Provisional application No. 62/563,875, filed on Sep. 27, 2017.

(51) Int. Cl.

| | |
|---|---|
| *H10D 30/69* | (2025.01) |
| *H10D 62/13* | (2025.01) |
| *H10D 62/822* | (2025.01) |
| *H10D 62/83* | (2025.01) |
| *H10D 62/832* | (2025.01) |
| *H10D 64/01* | (2025.01) |
| *H10D 64/23* | (2025.01) |
| *H10D 84/01* | (2026.01) |
| *H10D 84/03* | (2025.01) |
| *H10D 84/83* | (2025.01) |
| *H10D 84/85* | (2025.01) |
| *H10W 20/00* | (2026.01) |

(52) U.S. Cl.
CPC ....... *H10D 30/6219* (2025.01); *H10D 62/151* (2025.01); *H10D 64/01* (2025.01); *H10D 64/017* (2025.01); *H10D 64/251* (2025.01); *H10D 84/013* (2025.01); *H10D 84/0149* (2025.01); *H10D 84/0158* (2025.01); *H10D 84/038* (2025.01); *H10D 84/834* (2025.01); *H10D 84/853* (2025.01); *H10W 20/033* (2026.01); *H10W 20/076* (2026.01); *H10D 30/797* (2025.01); *H10D 62/822* (2025.01); *H10D 62/83* (2025.01); *H10D 62/832* (2025.01); *H10D 84/0193* (2025.01); *H10W 20/069* (2026.01)

(58) Field of Classification Search
CPC ........... H10D 30/0212; H10D 30/6219; H10D 64/251; H10D 30/797; H10D 62/151; H10D 84/013; H10D 84/038; H10D 62/822; H10D 62/83

See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,941,152 B2 | 4/2018 | Hsieh et al. | |
| 2006/0138398 A1 | 6/2006 | Shimamune et al. | |
| 2011/0210404 A1 | 9/2011 | Su et al. | |
| 2012/0126296 A1 | 5/2012 | Huang et al. | |
| 2013/0026538 A1* | 1/2013 | Liao | H10D 30/0275 257/190 |
| 2013/0113027 A1 | 5/2013 | Chiang et al. | |
| 2015/0021696 A1 | 1/2015 | Sung et al. | |
| 2015/0035023 A1 | 2/2015 | Kim et al. | |
| 2015/0041852 A1 | 2/2015 | Kwok et al. | |
| 2015/0084137 A1* | 3/2015 | Hsieh | H10W 20/081 257/407 |
| 2015/0303118 A1 | 10/2015 | Wang et al. | |
| 2016/0027918 A1 | 1/2016 | Kim et al. | |
| 2016/0043035 A1 | 2/2016 | Lin et al. | |
| 2017/0053916 A1* | 2/2017 | Ching | H10D 84/853 |
| 2017/0222014 A1* | 8/2017 | Tak | H10D 64/671 |
| 2018/0130886 A1 | 5/2018 | Kim et al. | |
| 2018/0151563 A1 | 5/2018 | Chang et al. | |
| 2018/0286861 A1* | 10/2018 | Choi | H10D 84/856 |

* cited by examiner

SEMICONDUCTOR STRUCTURE WITH BLOCKING LAYER

CROSS REFERENCE TO RELATED APPLICATIONS

This application is a Continuation of pending U.S. application Ser. No. 17/119,529, filed on Dec. 11, 2020, which is a divisional application of U.S. application Ser. No. 16/101, 897, filed on Aug. 13, 2018, which claims the benefit of U.S. Provisional Application No. 62/563,875, filed Sep. 27, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Silicon germanium epitaxial layers formed on source/drain terminals of the FinFET may electrically short-circuit in high-density areas of a chip where the fin pitch is narrow. Consequently, these electrical short-circuits can result in FINFET performance degradation and a lower yield of wafers.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-4A are cross-sectional views along line A-A' of FIG. 1 showing various stages of a method of forming a semiconductor structure, in accordance with some embodiments;

FIGS. 2B-4B are cross-sectional views along line B-B' of FIG. 1 showing various stages of a method of forming a semiconductor structure, in accordance with some embodiments.

DETAILED DESCRIPTION

Figure 1:
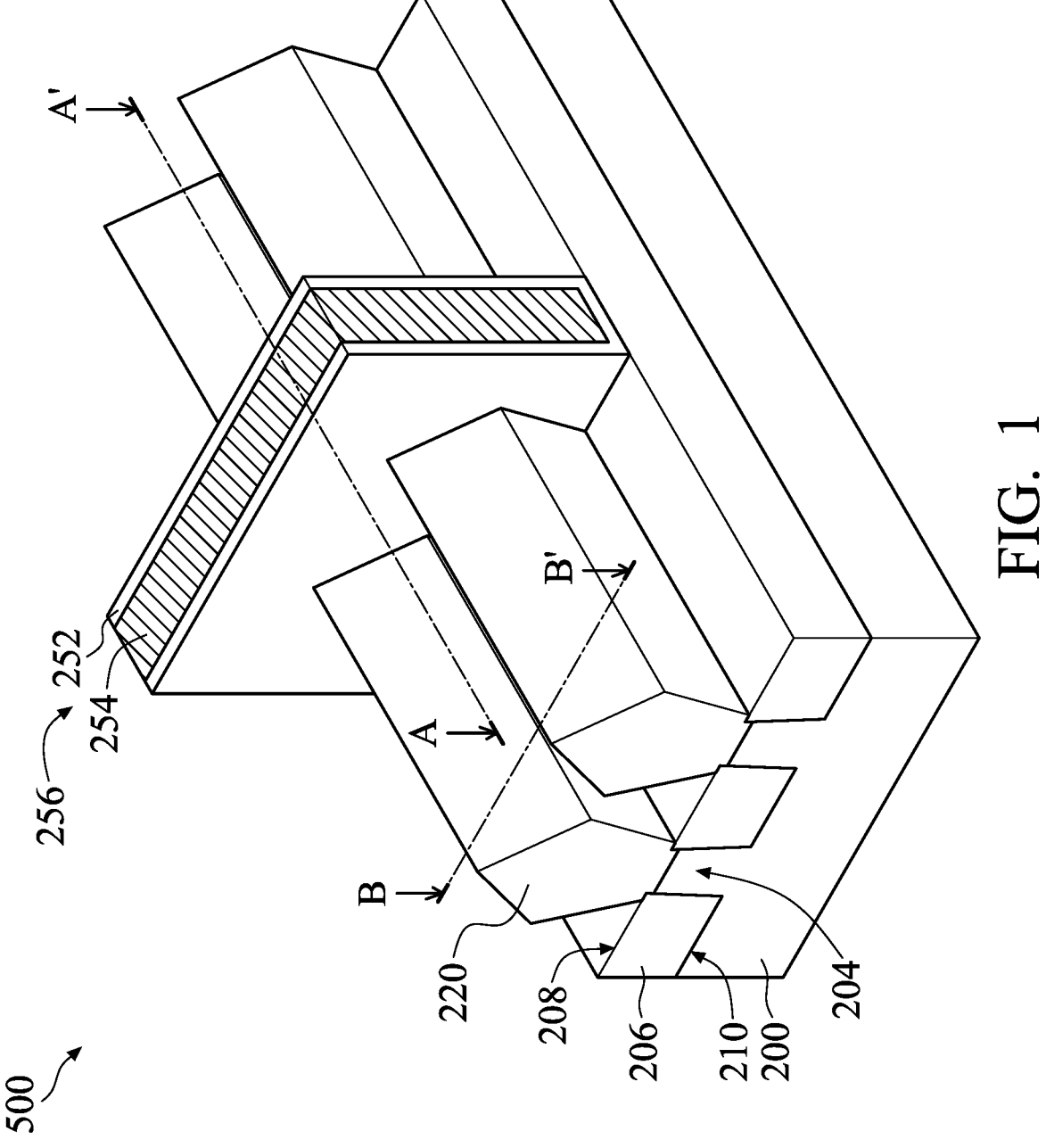
FIG. 1 is a three-dimensional view of an example simplified fin field effect transistor (FinFET) in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

As semiconductor manufacturing advances, smaller critical dimensions (CDs) and higher density areas with smaller pitch geometries are the development trends. However, in high density areas of a chip that include, for example, fin field effect transistor (FINFET) structures, smaller pitch geometries can be challenging. For example, fin pitch of the FINFET structures can create challenges to source/drain (S/D) formation for single-fin structures that are closely spaced to one another. For fins that are closely spaced (e.g., less than 60 nm spacing between FINFET structures), an epitaxial silicon germanium (SiGe) S/D of a fin can electrically short-circuit with the SiGe S/D of a neighboring fin. This undesirable situation results in a lower yield of wafers.

Embodiments provide a semiconductor structure that includes a source/drain structure, which has an increased raise height above the top surface of the fin structure, and a blocking layer, which encircles the contact structure. The source/drain structure may have an "elongated" diamond shape to prevent electrical short-circuits forming between neighboring FINFETs. In addition, the bottom surface of the blocking layer may be positioned in the source/drain structure and above the top surface of the fin structure. Therefore, the blocking layer may provide better insulation between the source/drain structure and the metal gate structure of the FinFET. In addition, the blocking layer may not increase the current path from the source/drain structure to the channel region of the FINFET.

FIG. 1 illustrates a three-dimensional (3D) view of an example of a simplified fin field effect transistor (FinFET) 500 in accordance with some embodiments. Other aspects not illustrated in or described with respect to FIG. 1 may become apparent from the following figures and description. The FinFET 500 includes a fin structure 204 on a substrate 200. The substrate 200 includes isolation regions 206, and the fin structure 204 protrudes above a top surface 208 of the isolation regions 206. In addition, the fin structure 204 may be formed between the neighboring isolation regions 206. A gate structure 256 including a gate dielectric layer 252 and a gate electrode layer 254 is positioned over the fin structure 204. The gate dielectric layer 252 is positioned along sidewalls and over the top surface of the fin structure 204, and a gate electrode layer 254 is positioned over the gate dielectric layer 252. Source/drain structures 220 are disposed in opposing regions of the fin structure 204 with respect to the gate dielectric layer 252 and the gate electrode layer 254. FIG. 1 further illustrates a reference cross-section A-A' and a reference cross-section B-B' that are used for later figures. The cross-section A-A' may be in a plane along, e.g., a channel in the fin structure 204 between the opposing source/drain structures 220. In addition, the cross-section B-B' may be in a plane along, a width of the fin structure 204.

The source/drain structures 220 may be shared between various transistors. In some examples, the source/drain structures 220 may be connected or coupled to other Fin-FETs such that the FinFETs are implemented as one functional transistor. For example, if neighboring (e.g., as opposed to opposing) source/drain regions are electrically connected, such as through merging the source/drain regions by epitaxial growth, one functional transistor may be implemented. Other configurations in other examples may implement other numbers of functional transistors.

Figure 3A:
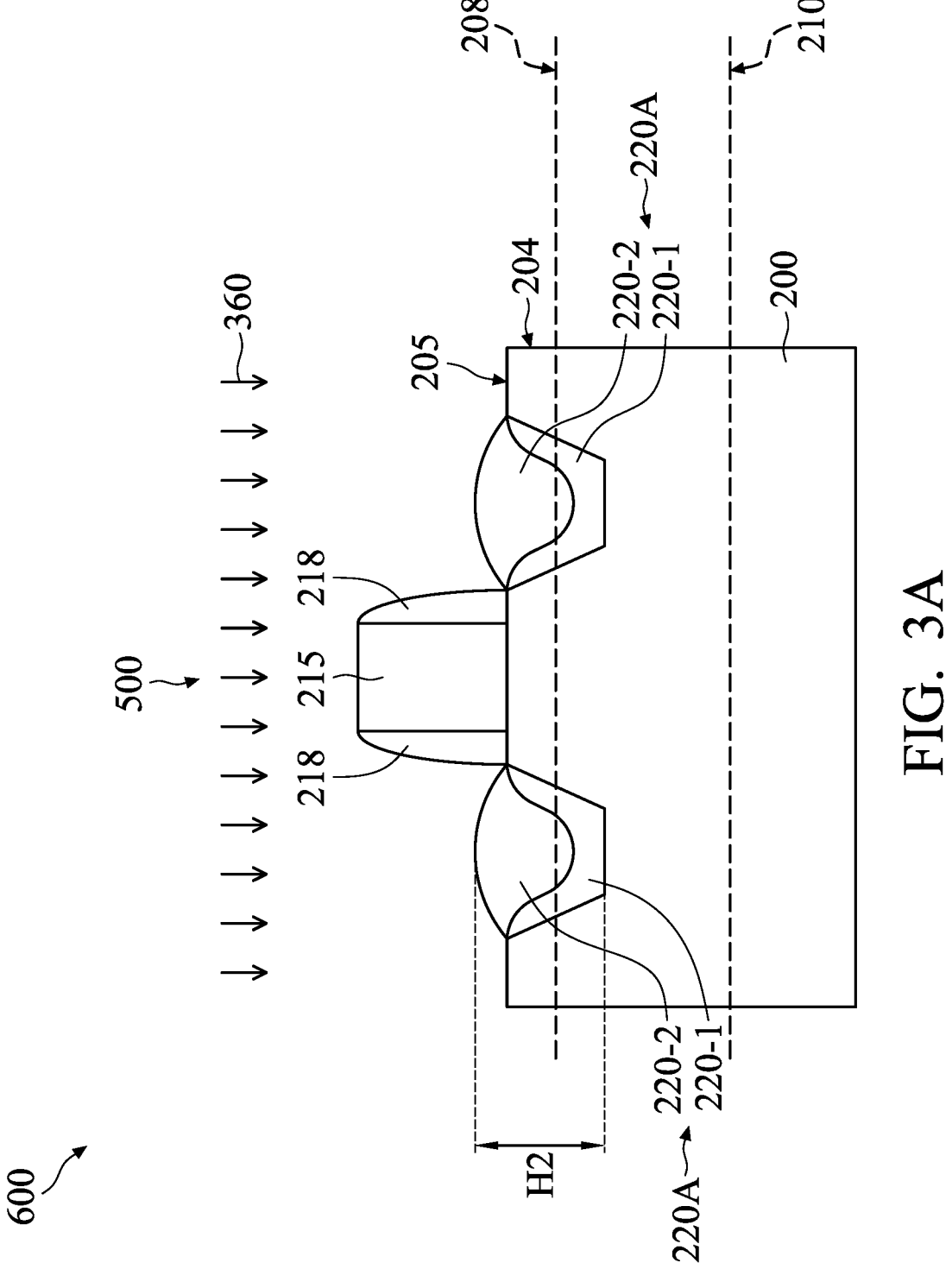
Figure 3B:
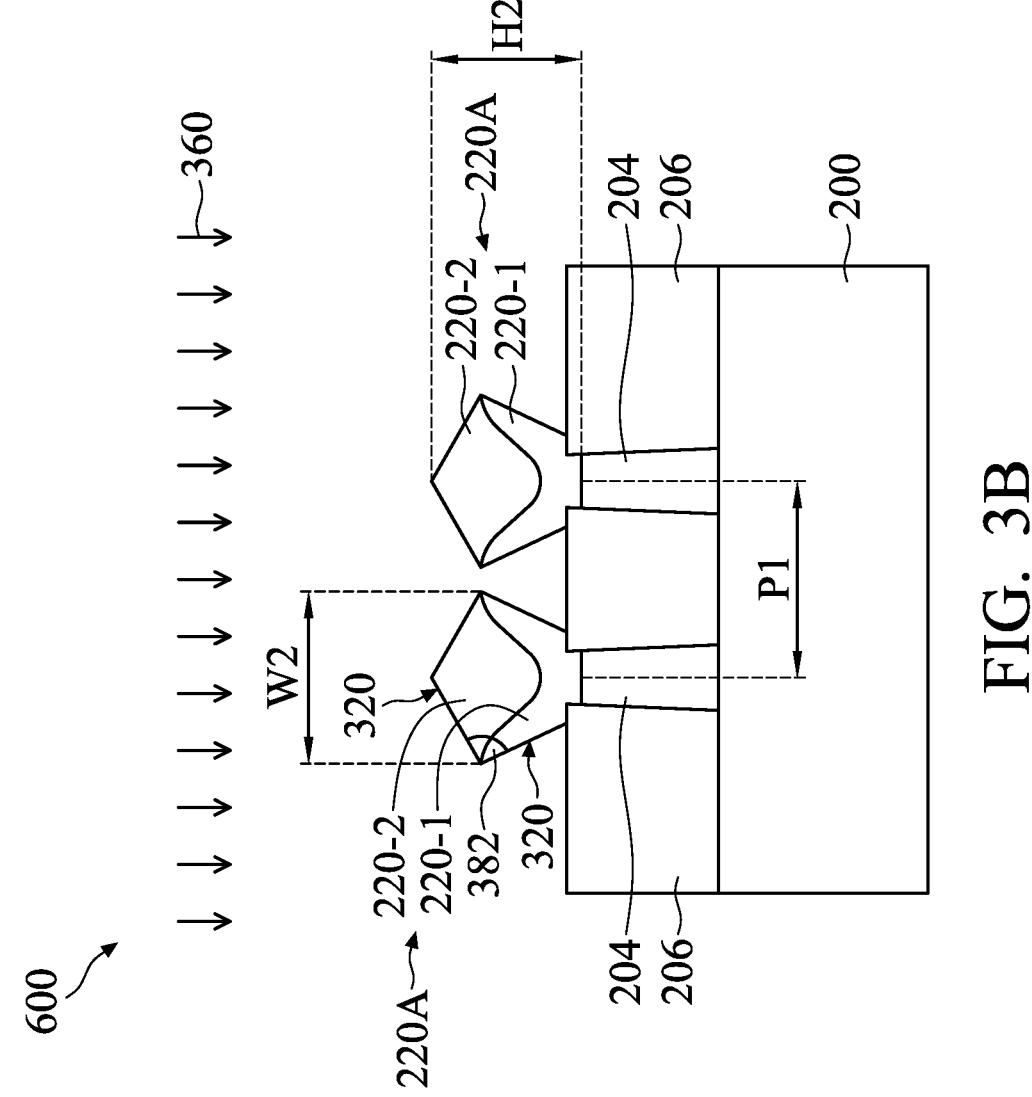
Figure 4A:
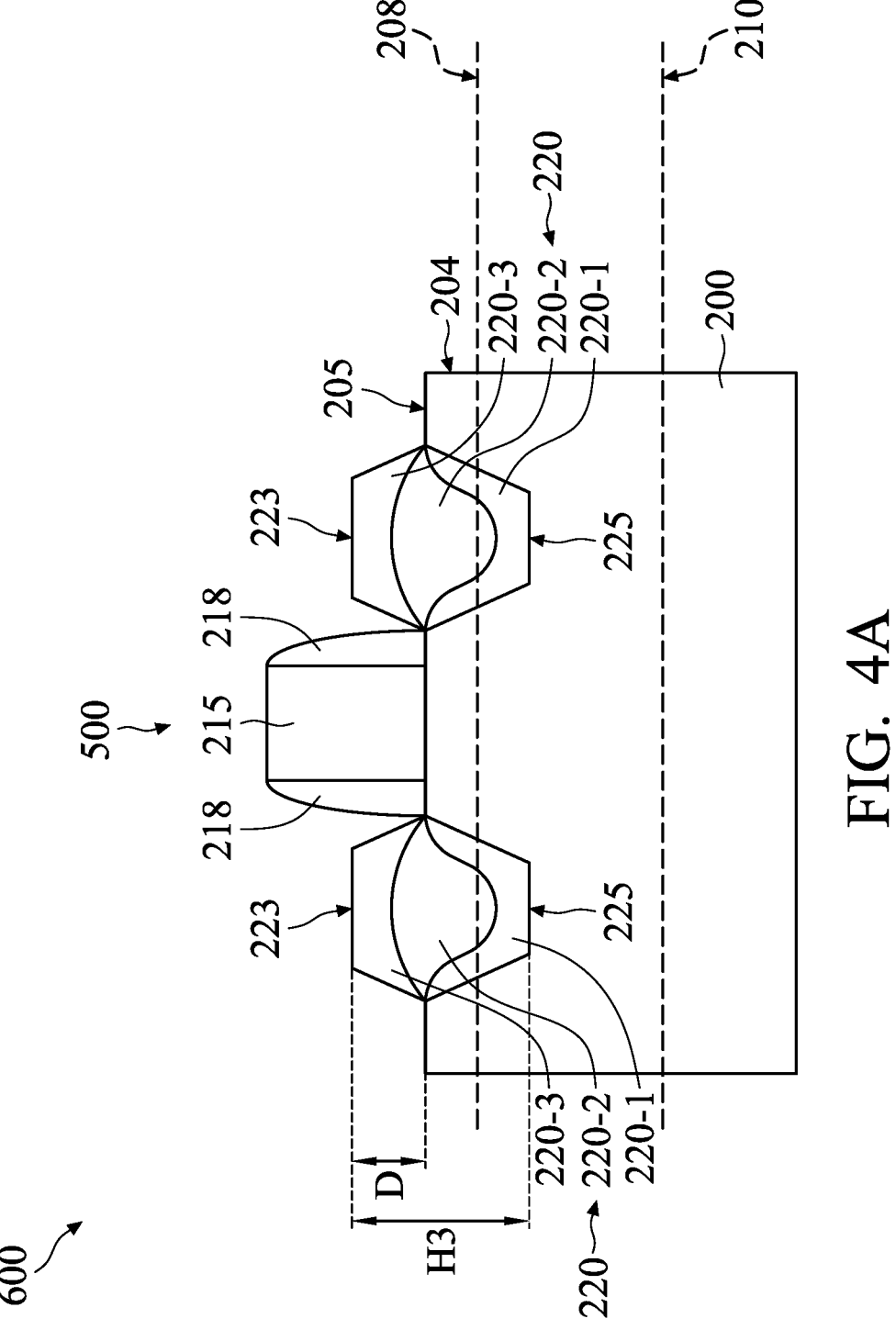

FIGS. 2A-4A are cross-sectional views along line A-A' of FIG. 1 showing various stages of a process for forming a semiconductor structure 600. FIGS. 2B-4B are cross-sectional views along line B-B' of FIG. 1 showing various stages of a method of forming the semiconductor structure 600. FIG. 5, FIG. 6, FIG. 7, FIG. 8, and FIG. 9 are cross-sectional views along line A-A' of FIG. 1 showing various stages of a method of forming the semiconductor structure 600 after the stage shown in FIG. 4A is performed. The direction along line A-A' of FIG. 1 coincides with the direction of plane (100), which is perpendicular to the surface of the substrate and is the same direction as the channel length. In addition, the direction along line B-B' shown in FIG. 1, coincides with the direction of plane (110), which is parallel to the surface of the substrate and is the same direction as the fin's width.

In some embodiments, a gate-replacement (gate-last) process is employed to fabricate the semiconductor structures 600, such as a fin field effect transistor (FinFET) (e.g. FinFETs 500). The semiconductor structure 600 includes a substrate 200 for FinFETs 500 formed thereon.

Figure 2A:
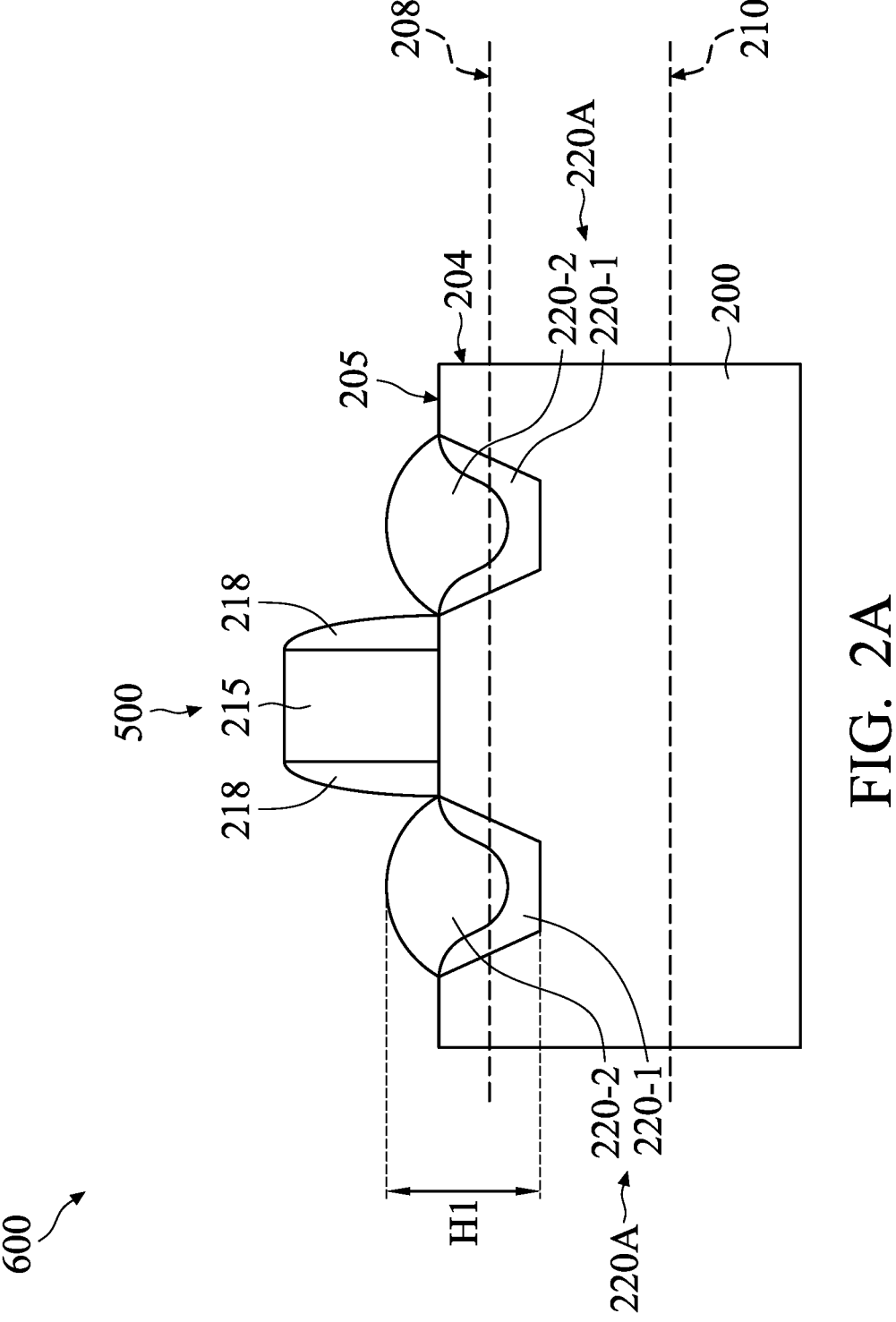
Figure 2B:
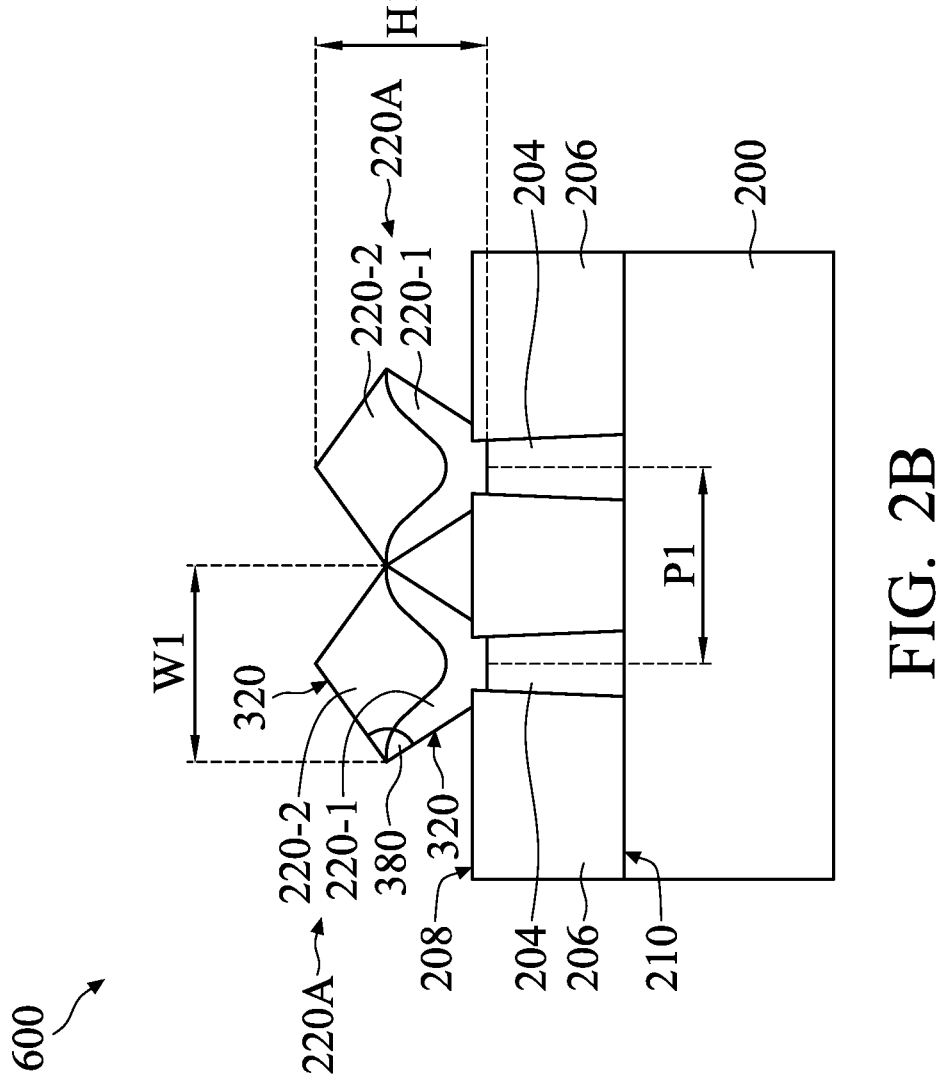

The substrate 200 including a plurality of fin structures 204 is received, as shown in FIGS. 2A and 2B in accordance with some embodiments. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 200 may be for forming P-type devices or N-type devices. For example, P-type devices may be P-type metal-oxide-semiconductor field-effect transistors (MOSFETs). N-type devices may be N-type MOSFETs. Therefore, the FinFETs 500 may be referred to as P-type FinFETs or N-type FinFET. For example, the FinFETs 500 may be P-type FinFETs.

In some embodiments, the fin structures 204 are formed on the substrate 200. The fin structures 204 can be made from the same material as the semiconductor substrate or a different material. By way of example and not limitation, the fin structures 204 can be made from silicon. The fin structures 204 is arranged adjacent to each other with a pitch P1, as shown in FIG. 2B in accordance with some embodiments. In some embodiments, the pitch P1 of the fin structures 204 is in a range from about 10 nm to about 60 nm. For example, the pitch P1 of the fin structures 204 may be a range from about 10 nm to about 40 nm. In addition, the fin structures 204 can have different pitch on different areas of the wafer (e.g., one fin pitch used for logic FINFETs and another fin pitch used for SRAM FINFETs). The fin structures 204 can also have different configurations or arrangements on a chip; for example, the fin structures 204 can be part of a large array of single-fin structures or a part of islands with two-fin structures. In some embodiments, the islands with two-fin structures have two fins that extend from the same protruded portion of the substrate, and the single-fin structures have fins that extend directly from the main portion of the substrate. In some other embodiments, the number of the fins that extend from the same protruded portion of the substrate in the islands with two-fin structures may be more than two. As would be understood by a person of ordinary skill in the art, these configurations and arrangements of the fin structures 204 are examples and are not intended to be limiting.

In some embodiments, the fin structure 204 is formed by performing a patterning process on the substrate 200. The fin structure 204 may be surrounded by trenches (not shown) formed in the substrate 200 by the patterning process. The isolation regions 206 (e.g. shallow trench isolation (STI) structures) may be formed on a bottom surface 210 of the trenches. A lower portion of the fin structure 204 is surrounded by the isolation structures 206, and an upper portion of the fin structure 204 protrudes from the top surface 208 of each of the isolation structures 206.

After the isolation regions are formed, a dummy gate structures 215 is formed over a top surface 205 of each of the fin structures 204, as shown in FIG. 2A in accordance with some embodiments. In addition, a hard mask layer (not shown) is formed on the dummy gate structure 215. In some embodiments, the dummy gate structure 215 covers the respective channel region of the resulting FinFET (e.g. the FinFET 500) on each of the fin structure 204. In some embodiments, the dummy gate structure 215 covers the top surface 205 and sidewalls of the fin structure 204, and extend over the isolation region 206 and the substrate 200 outside the fin structure 204. In some embodiments, the dummy gate structure 215 includes a gate dielectric (not shown) and a gate electrode (not shown) formed over the gate dielectric.

Afterwards, gate spacers 218 are formed on opposite sidewalls of the dummy gate structure 215 and over the fin structure 204, as shown in FIG. 2A in accordance with some embodiments. The gate spacers 218 may include a single layer structure or a multi-layer structure. The gate spacer spacers 218 may be made of low dielectric constant (low-k) materials (e.g. k<5), such as silicon oxide, silicon nitride, silicon oxynitride, silicon carbide, silicon carbonitride, another suitable material, or a combination thereof. In some embodiments, the gate spacers 218 are formed by a deposition process and a subsequent etching process. The deposition process may include a chemical vapor deposition (CVD) process, a physical vapor deposition (PVD) process, a spin-on process, another applicable process, or a combination thereof. The etching process may include a dry etch process.

After the gate spacers 218 are formed, the fin structure 204 is selectively recessed at locations adjacent to the gate spacers 218, and a first epitaxial layer 220-1 and a second epitaxial layer 220-2 are formed in recesses in each of the fin structures 204 and adjacent to the corresponding dummy gate structure 215, as shown in FIGS. 2A and 2B in accordance with some embodiments. The first epitaxial layer 220-1 and the second epitaxial layer 220-2 may be portions of a source/drain structure. For example, the first epitaxial layer 220-1 and the second epitaxial layer 220-2 may be SiGe epitaxial layers. In some embodiments, the first epitaxial layer 220-1 is grown over and in contact with the top surface 205 and a portion of the side surfaces of each of the fin structures 204. In addition, the first epitaxial layer 220-1 is in contact with each of the fin structures 204 in the recesses. Furthermore, the second epitaxial layer 220-2 may be positioned overlying and in contact with the first epitaxial layer 220-1.

In some embodiments, the first epitaxial layer 220-1 and the second epitaxial layer 220-2 are grown, using suitable methods such as the metal-organic CVD (MOCVD), molecular beam epitaxy (MBE), liquid phase epitaxy (LPE), vapor phase epitaxy (VPE), selective epitaxial growth (SEG), the like, or a combination thereof. The epitaxial growth process may be performed at high substrate temperatures (e.g., in a range from about 450° C. to about 740° C.). The epitaxial growth process may be performed in process pressure in a range from about 1 Torr to about 100

Torr. The epitaxial growth process may be performed using reactant gasses including silane ($SiH_4$), disilane ($Si_2H_6$), germane ($GeH_4$), diborane ($B_2H_6$), and hydrochloric acid (HCl). In addition, the reactant gases may include hydrogen ($H_2$), or nitrogen ($N_2$), or argon (Ar).

In some embodiments, the first epitaxial layer 220-1 has a germanium (Ge) atomic % in a range from about 0% to about 40%, and a boron (B) dopant concentration in a range from about $5 \times 10^{19}$ atoms/$cm^3$ to about $1 \times 10^{21}$ atoms/$cm^3$. In some embodiments, the first epitaxial layer 220-1 has a thickness in a range from greater than 0 nm to about 60 nm, such as 10 nm to 20 nm. For example, a bottom portion of the first epitaxial layer 220-1 has a thickness in a range from greater than 0 nm to about 60 nm, and a side portion of the first epitaxial layer 220-1 has a thickness in a range from greater than 0 nm to about 15 nm. In some embodiments, the second epitaxial layer 220-2 can have a Ge atomic % in a range from about 20% to about 80%, and a B dopant concentration in a range from about $1 \times 10^{20}$ atoms/$cm^3$ to about $3 \times 10^{21}$ atoms/$cm^3$. In some embodiments, the thickness of the second epitaxial layer 220-2 is in a range from greater than 0 nm to about 60 nm, such as 30 nm to 60 nm. As would be understood by a person of ordinary skill in the art, the aforementioned ranges are not intended to be limiting.

In some embodiments, the first epitaxial layer 220-1 and the second epitaxial layer 220-2 overlying the first epitaxial layer 220-1 may collectively form a "diamond shaped" source/drain structure 220A in each of the fin structures 204, as shown in FIGS. 2A and 2B in accordance with some embodiments. The source/drain structure 220A may have a width W1 along a (110) plane and a height H1 along a (100) plane. For example, the width W1 may be in a range from about 35 nm to about 45 nm, such as 40 nm. For example, the height H1 may be about in a range from about 55 nm to about 65 nm, such as 60 nm. However, these dimensions and shape are only examples and are not intended to be limiting since they are driven by the FINFET performance and can be adjusted accordingly depending on the FINFET's electrical characteristics. In addition, a pair of side surfaces 320 of each the "diamond shaped" source/drain structures 220A form an angle 380. In some embodiments, the angle 380 is in a range from about 45° to about 65°. It should be noted that a pair of side surfaces 320 of each of the "diamond shaped" source/drain structures 220A is positioned on the same side of the corresponding fin structures 204.

In some embodiments of SRAM FINFETs, if the pitch P1 of the fin structures 204 is too small (e.g., less than 60 nm), the source/drain structure 220A may be at risk of being in physical (and electrical) contact at the end of the epitaxial layer growth process. This undesirable situation may be result in electrical short-circuits forming between neighboring FinFETs. To overcome this undesirable situation, a selective etching process (such as a selective etching process 360 described in the following detailed descriptions) can be performed to decrease the width W1 of each of the source/drain structure 220A. However, in some other embodiments, the source/drain structure 220A may be merged together without performing the aforementioned etching process. In yet other embodiments, if the pitch P1 of the fin structures 204 is large enough, the aforementioned etching process has no need to be performed.

Afterwards, a selective etching process 360 is performed on the "diamond shaped" source/drain structures 220A to reduce the width W1 (FIG. 2B) of each of the source/drain structures 220A, as shown in FIGS. 3A and 3B in accordance with some embodiments. For example, the selective etching process 360 may be performed to etch a portion of the pair of side surfaces 320 of each the source/drain structures 220A. In some embodiments, the selective etching process 360 is a lateral etching process, which can be an in-situ process. For example, the selective etching process 360 may be performed in the same cluster tool or in the epitaxial growth reactor without a vacuum break. This can be advantageous for several reasons. For example, the in-situ process does not impact the tool's throughput as much as an ex-situ process that requires a vacuum break or additional equipment. In addition, the in-situ process ensures better process and particle control than the ex-situ process.

In some embodiments, the selective etching process 360 is performed using etching gases including hydrochloric acid (HCl), germane ($GeH_4$), and chlorine ($Cl_2$). As would be understood by a person of ordinary skill in the art, these gasses may be introduced as a mixture or one at a time. Furthermore, other gas combinations may be possible. In some embodiments, a flow rate for HCl is in a range from about 40 sccm to about 1000 sccm, a flow rate for $GeH_4$ is in a range from about 0 sccm to about 1000 sccm, and a flow rate for $Cl_2$ is in a range from about 0 sccm to about 100 sccm. In some embodiments, the selective etching process 360 is performed in a process temperature in a range from about 450V to about 800° C. In addition, the etch time of the selective etching process 360 may be in a range from about 5 seconds to about 1200 seconds. As would be understood by a person of ordinary skill in the art, these ranges are merely examples and are not intended to be limiting.

In some embodiments, the selective etching process 360 has high selectivity along the (110) plane, which is parallel to the top surfaces 205 of the fin structures 204. Consequently, the etch rate along the direction perpendicular to the top surfaces 205 of the fin structures 204 and along the (100) plane) is nominally zero or insignificant. For example, the etched height of each of the source/drain structures 220A may be in a range from about 0 nm to about 5 nm. As would be understood by a person of ordinary skill in the art, the lateral etch selectivity (along the (110) plane) can be tuned through etch process parameters, such as the flow rates of the etching gases and the process temperature. Etch rate and lateral selectivity can also depend on the B and Ge atomic % for the second epitaxial layer 220-2 and the first epitaxial layer 220-1 of each of the source/drain structures 220A. Any or all combinations of the flow rates of the etching gases, the process temperature, Ge atomic %, and B dopant concentrations can be used to tailor the final etch process and optimize the lateral selectivity. In some embodiments, higher process temperatures, higher Ge atomic %, and higher gas flow rates can favor the lateral etch selectivity along the (110) plane, which is in the direction of the fin's width (x-direction).

After the selective etching process 360 is performed, each of the source/drain structures 220A has a width W2 along a (110) plane and a height H2 along an (100) plane, as shown in FIGS. 3A and 3B in accordance with some embodiments. For example, the width W2 of each of the source/drain structures 220A may be narrower than the width W1 (FIG. 2B) of each of the source/drain structures 220A before performing the selective etching process 360 in a range from about 0 nm to about 20 nm. Additionally, due to the lateral selectivity of the selective etching process 360, the height H2 is not substantially affected by the selective etching process 360. For example, the height H2 of each of the source/drain structures 220A may be lower than the height H1 of each of the source/drain structures 220A before performing the selective etching process 360 in a range from about 0 nm to about 5 nm. In addition, the angle 382 between a pair of side surfaces 320 of each the source/drain structures 220A may be in a range from about 55° to about 180° after the selective etching process 360 is performed.

Figure 4B:
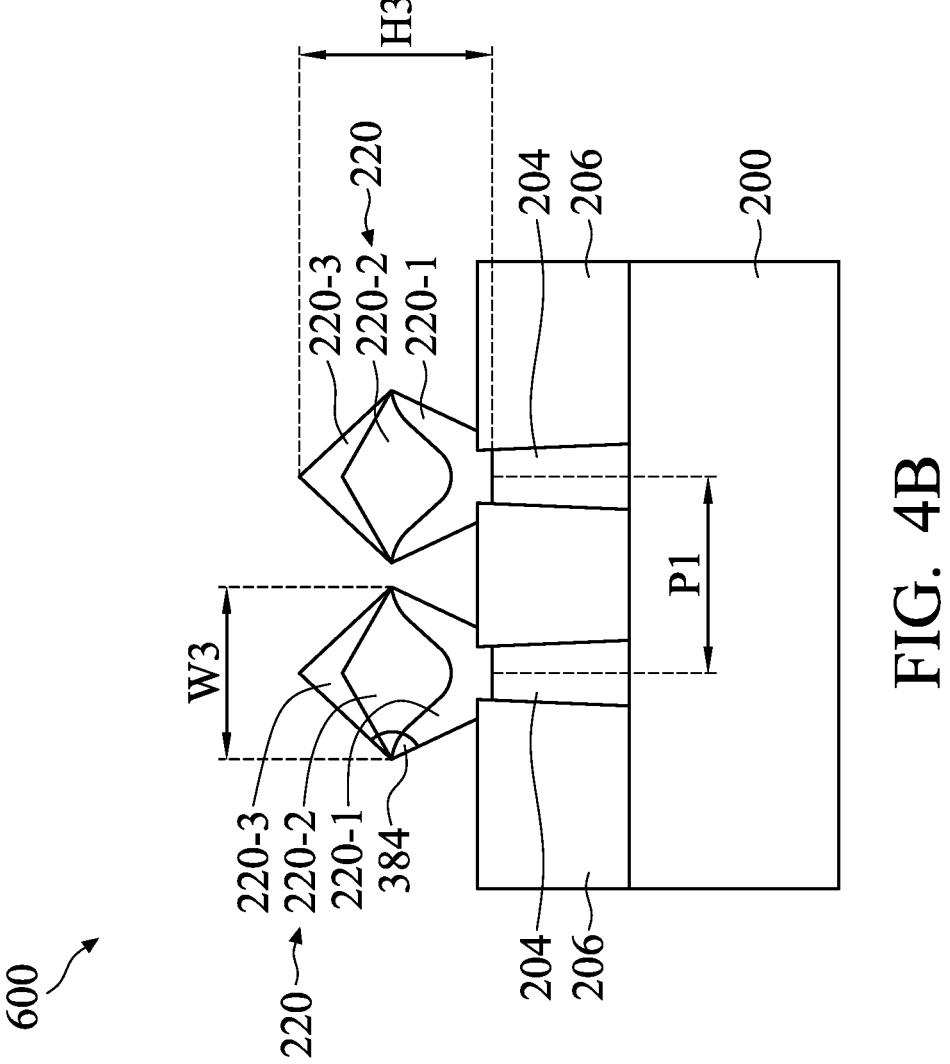

Afterwards, a capping epitaxial layer 220-3 is grown over the second epitaxial layer 220-2 of each the source/drain structures 220A (FIGS. 3A and 3B), as shown in FIGS. 4A and 4B in accordance with some embodiments. The capping epitaxial layer 220-3 may include a silicon germanium epitaxial layer having similar Ge atomic % and B dopant concentrations as the first epitaxial layer 220-1. In some embodiments, the capping epitaxial layer 220-3 with a germanium atomic % in a range from about 0% and 40%, a boron dopant concentration in a range from about $5 \times 10^{19}$ atoms/$cm^3$ to about $1 \times 10^{21}$ atoms/$cm^3$. In some embodiments, the thickness of the capping epitaxial layer 220-3 is in a range from greater than 0 nm to about 15 nm. The processes of the capping epitaxial layer 220-3 may be similar to, or the same as, those of the first epitaxial layer 220-1 and the second epitaxial layer 220-2, and the details thereof are not repeated herein.

After the capping epitaxial layer 220-3 over the second epitaxial layer 220-2 of each the source/drain structures 220 is grown, source/drain structures 220 are formed in the corresponding fin structures 204 and adjacent to the corresponding dummy gate structures 215, as shown in FIGS. 4A and 4B in accordance with some embodiments. Each the source/drain structures 220 may have an "elongated" diamond shape. Specifically, the source/drain structures 220 are elongated along the direction that is substantially perpendicular to the top surfaces 205 of the fin structures 204. In addition, each of the source/drain structures 220 includes the first epitaxial layer 220-1, the second epitaxial layer 220-2 and the capping epitaxial layer 220-3. In the same source/drain structure 220, a top surface 223 of the capping epitaxial layer 220-3 may serve as a top surface for each of the source/drain structures 220. In addition, a bottom surface 225 of the first epitaxial layer 220-1 may serve as a bottom surface for each of the source/drain structures 220. Therefore, the top surface 223 of the capping epitaxial layer 220-3 and the bottom surface 225 of the first epitaxial layer 220-1 may collectively serve as a boundary of each of the source/drain structures 220. In some embodiments, the first epitaxial layer 220-1 is positioned at a lower portion of the boundary (i.e. the bottom surface 225 of the first epitaxial layer 220-1) and in contact with the corresponding fin structure 204. The capping epitaxial layer 220-3 may be positioned at an upper portion of the boundary (i.e. the top surface 223 of the capping epitaxial layer 220-3). In addition, the second epitaxial layer 220-2 may be positioned between the first epitaxial layer 220-1 and the capping epitaxial layer 220-3.

For example, the source/drain structures 220 may be P-type SiGe source/drain structures. The P-type SiGe source/drain structures may have a high concentration of holes (majority carriers) as a result of a hole-donor dopant such as boron (B). In some embodiments, a germanium atomic % of each of the source/drain structures is decreased from a center of each of the source/drain structures 220 (i.e. the position where the second epitaxial layer 220-2 is located) to a boundary of each of the source/drain structures 220 (i.e. the position where the first epitaxial layer 220-1 and the capping epitaxial layer 220-3 are located). In some embodiments, a boron dopant concentration of each of the source/drain structures 220 is decreased from a center of each of the source/drain structures to a boundary of each of the source/drain structures 220.

In some embodiments, each of the source/drain structures 220 has a width W3 along a (110) plane and a height H3 along a (100) plane, as shown in FIG. 4B. For example, the width W3 of each of the source/drain structures 220 may be substantially the same as the width W2 (FIG. 3B) of each of the source/drain structures 220. For example, the height H3 of each of the source/drain structures 220 may be higher than the height H2 (FIG. 3B) of each of the source/drain structures 220 in a range from about 0 nm to about 10 nm. After the capping epitaxial layer 220-3 is formed, the angle 384 between a pair of side surfaces 320 of each the source/drain structures 220 may be in a range from about 55° to about 180°. In addition, a pair of side surfaces 320 of each of the source/drain structure structures 220 is positioned on the same side of the corresponding fin structure 204. In some embodiments, the height H3 of each of the source/drain structures 220 is greater than the pitch P1 of the fin structures 204.

In some embodiments, as shown in FIG. 4B taken along a direction that is substantially perpendicular to the longitudinal direction (the channel direction) of the adjacent fin structures 204, the source/drain structure structures 220 positioned on the adjacent fin structure 204 are separated from each other. Due to the selective etching process 360, the resulting source/drain structure structures 220 of neighboring fin structures 204 may be better isolated, and electrical short-circuits can be prevented.

In some embodiments, the top surface 205 of each of the fin structures 204 is between the top surface 223 and the bottom surface 225 of the each of the source/drain structure structures 220. For example, the top surface 223 of each of the source/drain structures 220 is positioned above the top surface 205 of each of the fin structures 204 by a distance D (the raise height) in a range from about 0 nm to about 15 nm, such as 5-10 nm. The source/drain structures 220 having the raise height (the distance D) may reduce the resistance of the source/drain structure. Therefore, each of the source/drain structures 220 may serve as a raised source/drain structure.

Figure 5:
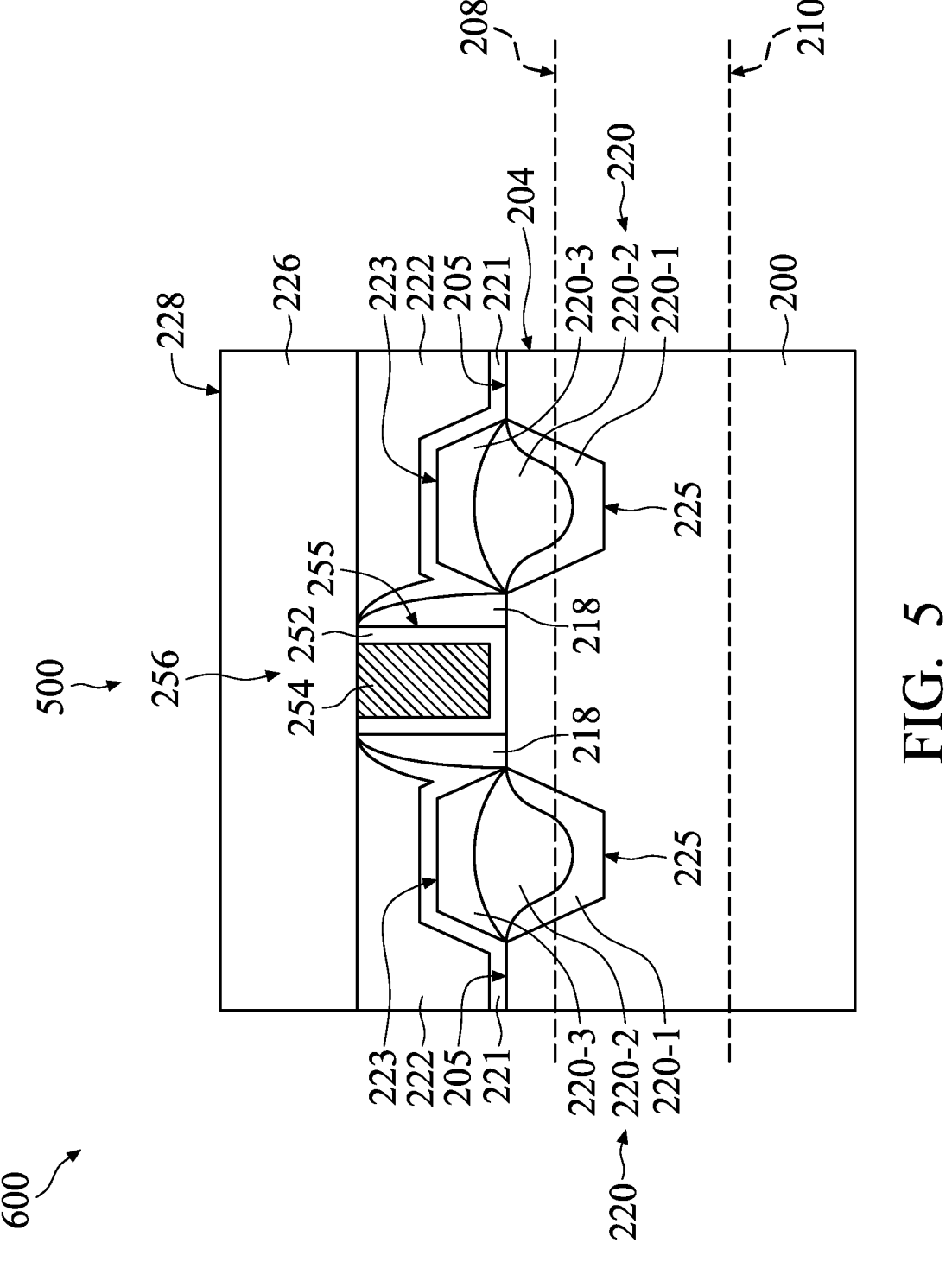
FIG. 5, FIG. 6, FIG. 7, FIG. 8, and FIG. 9 are cross-sectional views along line A-A' of FIG. 1, showing various stages of a method of forming a semiconductor structure after the stage shown in FIG. 4A, in accordance with some embodiments.

After the source/drain structures 220 are formed, a contact etch stop layer (CESL) 221 is conformally deposited over the source/drain structures 220 and the gate spacers 218 by a thin film deposition process, as shown in FIG. 5 in accordance with some embodiments. In some embodiments, the bottom surface of the CESL 221 is in contact with the top surface 223 of the source/drain structures 220. The CESL 221 may serve as an etch stop layer of the subsequent etching process configured to form source/drain contact holes (not shown). In some embodiments, the CESL 221 may be a single layer or multiple layers. The CESL 221 may be made of silicon carbide (SiC), silicon nitride (Si$_x$N$_y$), silicon carbonitride (SiCN), silicon oxycarbide (SiOC), silicon oxycarbon nitride (SiOCN), tetraethoxysilane (TEOS) or another applicable material. In some embodiments, the CESL 221 has a bi-layer structure which includes a TEOS layer formed on a SiC layer. A TEOS layer has better moisture prevention than a SiC layer. In addition, a SiC layer is used as a glue layer to improve adhesion between the underlying layer and the TEOS layer. In some embodiments, the CESL 221 is formed by performing a plasma enhanced chemical vapor deposition (CVD) process, a low pressure CVD process, an atomic layer deposition (ALD) process, or another applicable process.

After the CESL 221 is formed, a dielectric layer 222 (such as a first inter-layer dielectric (ILD) layer) is formed over the fin structures 204, the dummy gate structures 215 (FIG. 4A), the gate spacers 218, and the source/drain structures 220, as shown in FIG. 5 in accordance with some embodiments. In some embodiments, the dummy gate structure 215 (FIG. 4A) are surrounded by the dielectric layer 222.

In some embodiments, a deposition process is performed to form the dielectric layer 222 over the CESL 221, the source/drain structures 220 and the dummy gate structure 215 (FIG. 4A). Afterwards, a planarization process is performed to level the top surfaces of CESL 221, the dielectric layer 222, the gate spacers 218, and the dummy gate structures 215 (FIG. 4A).

In some embodiments, the dielectric layer 222 is made of a dielectric material such as silicon oxide, phosphosilicate glass (PSG), borosilicate glass (BSG), boron-doped phosphosilicate glass (BPSG), undoped silicate glass (USG), carbon-doped silicate glass, silicon nitride or silicon oxynitride. In some embodiments, the dielectric layer 222 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon dioxide (SiO$_2$). In some embodiments, ELK dielectric material is deposited by a plasma enhanced chemical vapor deposition (PECVD) process or by a spin coating process.

In some embodiments, the deposition process of the dielectric layer 222 includes a plasma enhanced chemical vapor deposition (CVD) process, a low pressure CVD process, an atomic layer deposition (ALD) process, flowable CVD (FCVD process), a spin-on coating process, or another applicable process. In some embodiments, the planarization process of the dielectric layer 222 includes a chemical mechanical polishing (CMP) process, a grinding process, an etching process, another applicable process, or a combination thereof.

After the dielectric layer 222 is formed, gate structures 256, such as metal gate structures, are formed to replace the dummy gate structures 215 (FIGS. 4A and 4B) by a removal process, a deposition processes and a subsequent planarization process, as shown in FIG. 5 in accordance with some embodiments. In some embodiments, each of the gate structures 256 surrounded by the corresponding gate spacers 218 includes a gate dielectric layer 252 and a gate electrode layer 254 over the gate dielectric layer 252. The source/drain structures 220 may be positioned adjacent to the gate structures 256. In some embodiments, the gate spacers 218 are positioned on opposite sidewall surfaces 255 of the gate structure 256.

In some embodiments, each of the gate dielectric layers 252 includes a single layer or multiple layers. In some embodiments, the gate dielectric layers 252 are formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layers 252 may include molecular beam deposition (MBD), atomic layer deposition (ALD), plasma enhanced CVD (PECVD), and the like.

In some embodiments, the gate electrode layer 254 is made of a metal-containing material such as TiN, TaN, TaC, Co, Ru, Al, combinations thereof, or multi-layers thereof, and are formed by a deposition process, such as electroplating, electroless plating, or another suitable method.

In some embodiments, a work function layer (not shown) may be formed in each of the gate structures 256. The work function layer may include an N-type work-function layer or a P-type work-function layer. The P-type work function layer may include TiN, TaN, Ru, Mo, Al, WN, $ZrSi_2$, $MoSi_2$, $TaSi_2$, $NiSi_2$, WN, another suitable P-type work function material, or a combination thereof. The N-type work function layer may include Ti, Ag, TaAl, TaAlC, TiAlN, TaC, TaCN, TaSiN, Mn, Zr, another suitable N-type work function material, or a combination thereof. In some embodiments, as shown in FIG. 1A, the work function layer in each of the gate structures 256 may include the P-type work-function layer.

Afterward, a dielectric layer (e.g. a second inter-layer dielectric (ILD) layer)) 226 is formed over the dielectric layer 222 and the gate structures 256, as shown in FIG. 5 in accordance with some embodiments. For example, the dielectric layer 226 may be a flowable film formed by a flowable CVD method. In some embodiments, the dielectric layer 226 is formed of a dielectric material such as PSG, BSG, BPSG, USG, or the like, and may be deposited by any suitable method, such as CVD and PECVD.

Figure 6:
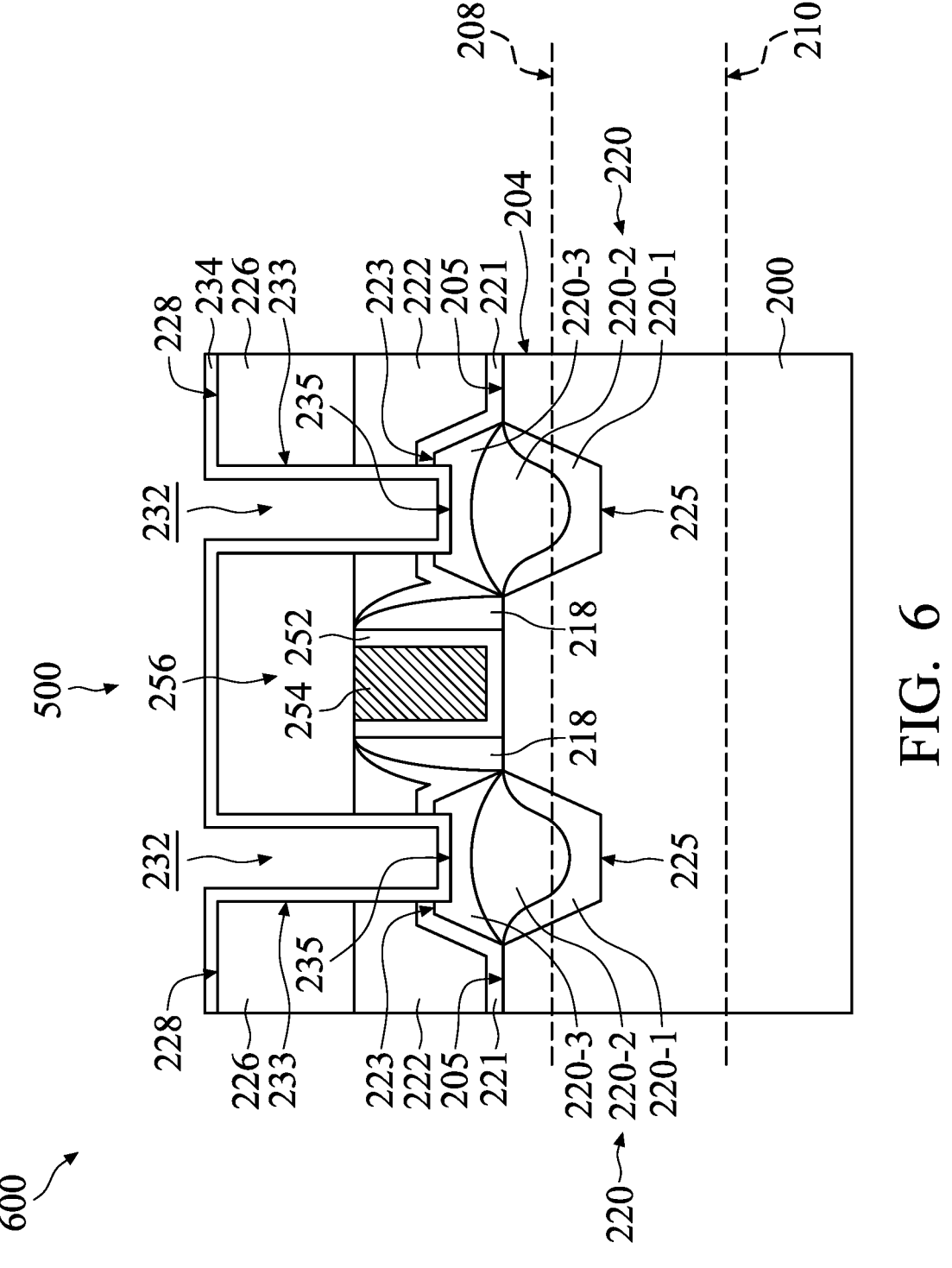

After the dielectric layer 226 is formed, openings 232 in the dielectric layers 222 and 226 by a patterning process, as shown in FIG. 6 in accordance with some embodiments. The patterning process may be performed to remove portions of the dielectric layers 222 and 226 and portions of the CESL 221 and portions of the source/drain structures 220 to form the openings 232 and to stop on the source/drain structures 220. Therefore, the openings 232A and 232B are formed passing through the dielectric layers 222 and 226 and the CESL 221 to expose the source/drain structures 220. In some embodiments, upper surfaces 235 of the source/drain structures 220 in the openings 232 is positioned above the top surface 205 of the fin structures 204. For example, the upper surfaces 235 of the source/drain structures 220 may be positioned within the capping epitaxial layers 220-3 or the second epitaxial layers 220-2 of the source/drain structures 220.

In some embodiments, the patterning process of the openings 232 include a photolithography processes and a subsequent etching process. The photolithography process may form photoresist patterns (not shown) on a top surface 228 of the dielectric layer 226. The photolithography process may include photoresist coating (e.g. spin-on coating), soft baking, mask aligning, exposure, post-exposure baking, developing the photoresist, rinsing and drying (e.g. hard baking). In some embodiments, the etching process is a dry etching process. In addition, etching gases used in the etching process may include fluorine-containing (F-containing) gases. After the openings 232 are formed, the photoresist patterns may be removed.

Afterward, a blocking layer 234 is deposited lining a sidewall surface 233 of the openings 232, as shown in FIG. 6 in accordance with some embodiments. The blocking layer 234 may be conformally formed over the dielectric layers 222 and 226 and the source/drain structures 220. In some embodiments, the blocking layer 234 and the gate spacers 218 are formed of the same material. The blocking layer 234 and the CESL may be formed of the same material. For example, the blocking layer 234 may be made of low dielectric constant (low-k) materials (e.g. k<5), such as silicon oxide, silicon nitride, silicon oxynitride, silicon carbide (SiC), silicon carbonitride (SiCN), silicon oxycarbide (SiOC), silicon oxycarbon nitride (SiOCN), tetraethoxysilane (TEOS) or another applicable material, another suitable material, or a combination thereof. In some embodiments, the gate spacers 218 are formed by a deposition process and a subsequent etching process. The deposition process may include a chemical vapor deposition (CVD) process, an atomic layer deposition (ALD), another applicable process, or a combination thereof.

Figure 7:
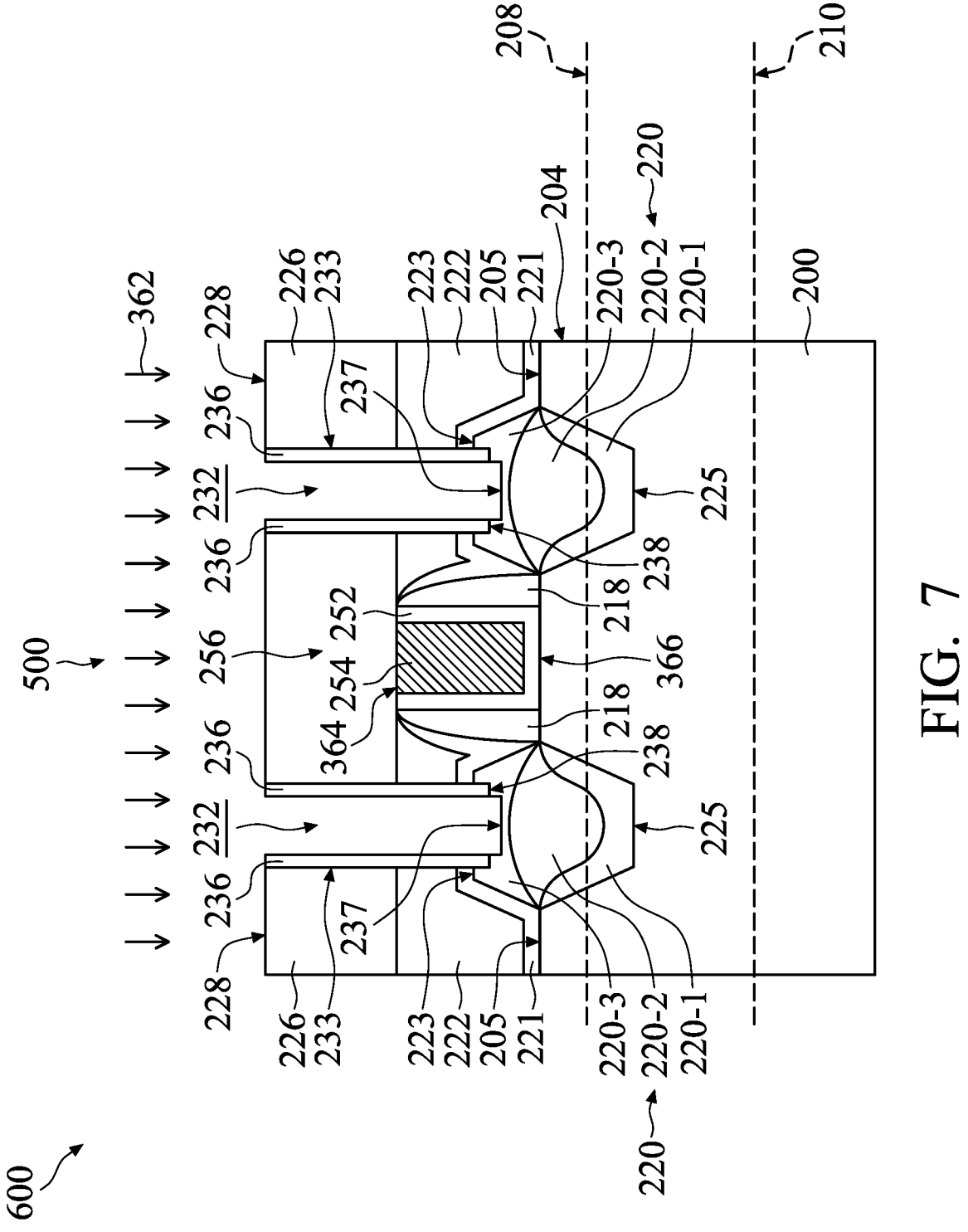

Afterward, a portion of the blocking layer 234 (FIG. 6) in the openings 232 is removed to form blocking layers 236, as shown in FIG. 7 in accordance with some embodiments. The blocking layers 236 may provide additional insulation between the source/drain structures 220 and the gate structures 256 of the resulting FinFETs. In some embodiments, the blocking layers 236 are formed lining the sidewall surfaces 233 of the openings 232 and expose the source/drain structures 220 by an etching process 362. In addition, the etching process 362 may be performed to remove a portion of the blocking layer 234 above the top surface 228 of the dielectric layer 226. Furthermore, the etching process 362 may be performed to remove portions of the source/drain structures 220 in the openings 232 from the upper surfaces 235 of the source/drain structures 220 (FIG. 6). After the etching process 362 is performed, the source/drain structures 220 in the openings 232 are exposed. In some embodiments, the bottom surfaces of the openings 232 are higher than the top surfaces of the second epitaxial layers 220-2.

In some embodiments, upper surfaces 237 of the source/drain structures 220 in the openings 232 are positioned above the top surface 205 of the fin structures 204. In addition, the position of the upper surfaces 237 of the source/drain structures 220 (FIG. 7) is positioned lower than the position of the upper surfaces 235 of the source/drain structures 220 (FIG. 6). For example, the upper surfaces 237 of the source/drain structures 220 may be positioned within the capping epitaxial layers 220-3 or the second epitaxial layers 220-2 of the source/drain structures 220.

In some embodiments, a bottom surface 238 of each of the blocking layers 236 is between the top surface 205 of the fin structure 204 and the top surface 223 (FIG. 5) of each of the source/drain structures 220. In addition, the bottom surface 238 of each of the blocking layers 236 may be positioned between the top surface 364 of each of the gate structures 256 and the bottom surface 366 of each of the gate structures 256 (the bottom surface 366 of each of the gate structures 256 is level with the top surface 205 of each of the fin structures 204). The bottom surface 238 of each of the blocking layers 236 is in contact with the corresponding source/drain structure 220.

Figure 8:
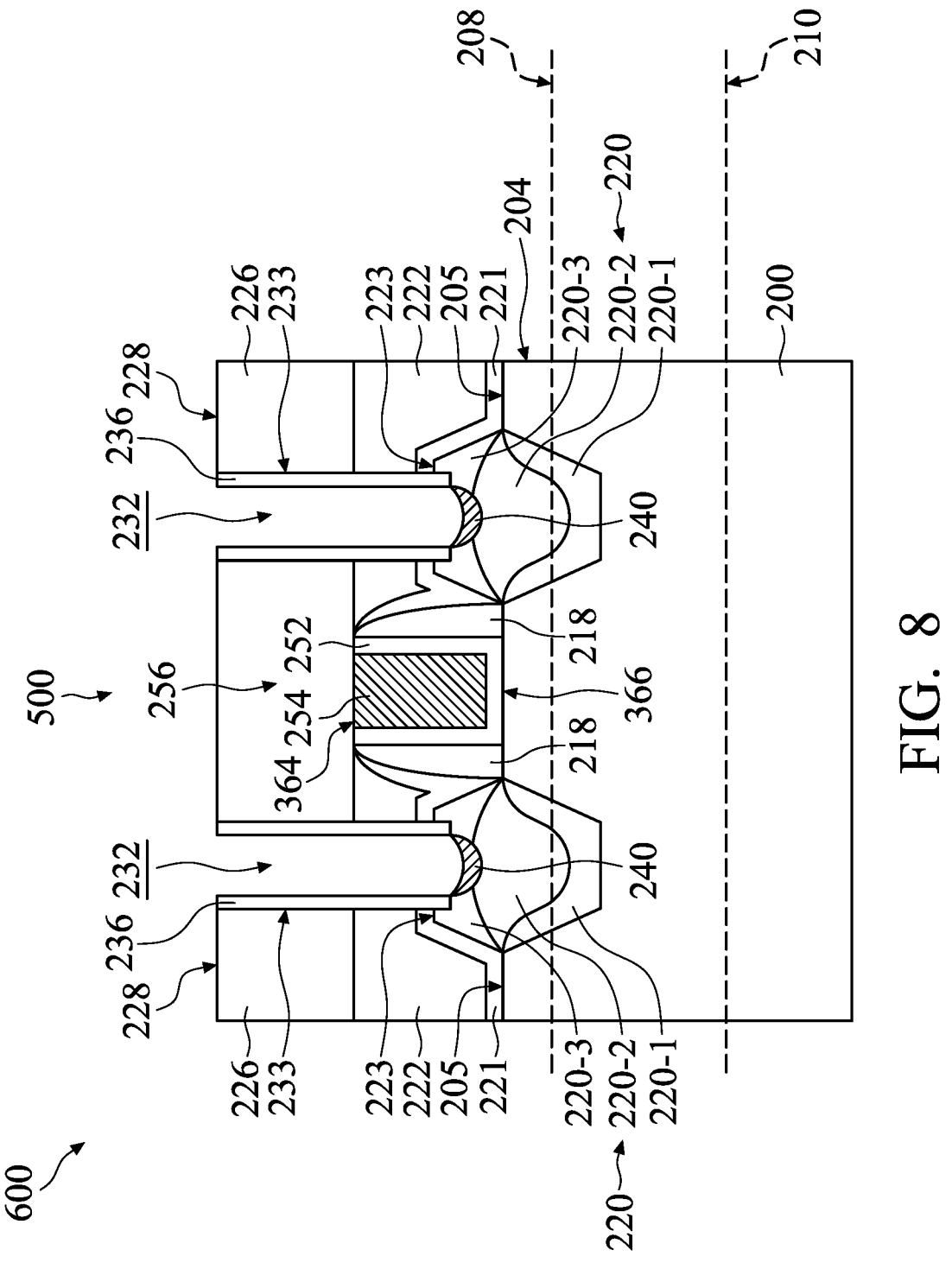

Afterward, source/drain silicide layers 240 are formed on the source/drain structures 220 in the openings 232 by a silicidation process, as shown in FIG. 8 in accordance with some embodiments. For example, the source/drain silicide layers 240 may be formed in a portion of the capping epitaxial layers 220-3. For example, the source/drain silicide layers 240 may be formed in a portion of the second epitaxial layers 220-2 of the source/drain structures 220. In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C. After the annealing process, the unreacted metal material is removed.

In some embodiments, the source/drain silicide layers 240 are formed of one or more of cobalt silicide (e.g. CoSi, $CoSi_2$, $Co_2Si$, $Co_2Si$, $Co_3Si$; collectively "Co silicide"), titanium silicide (e.g. $Ti_5Si_3$, TiSi, $TiSi_2$, $TiSi_3$, $Ti_6Si_4$; collectively "Ti silicide"), nickel silicide (e.g. $Ni_3Si$, $Ni_{31}Si_{12}$, $Ni_2Si$, $Ni_3Si_2$, NiSi, $NiSi_2$; collectively "Ni silicide"), copper silicide (e.g. $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

Figure 9:
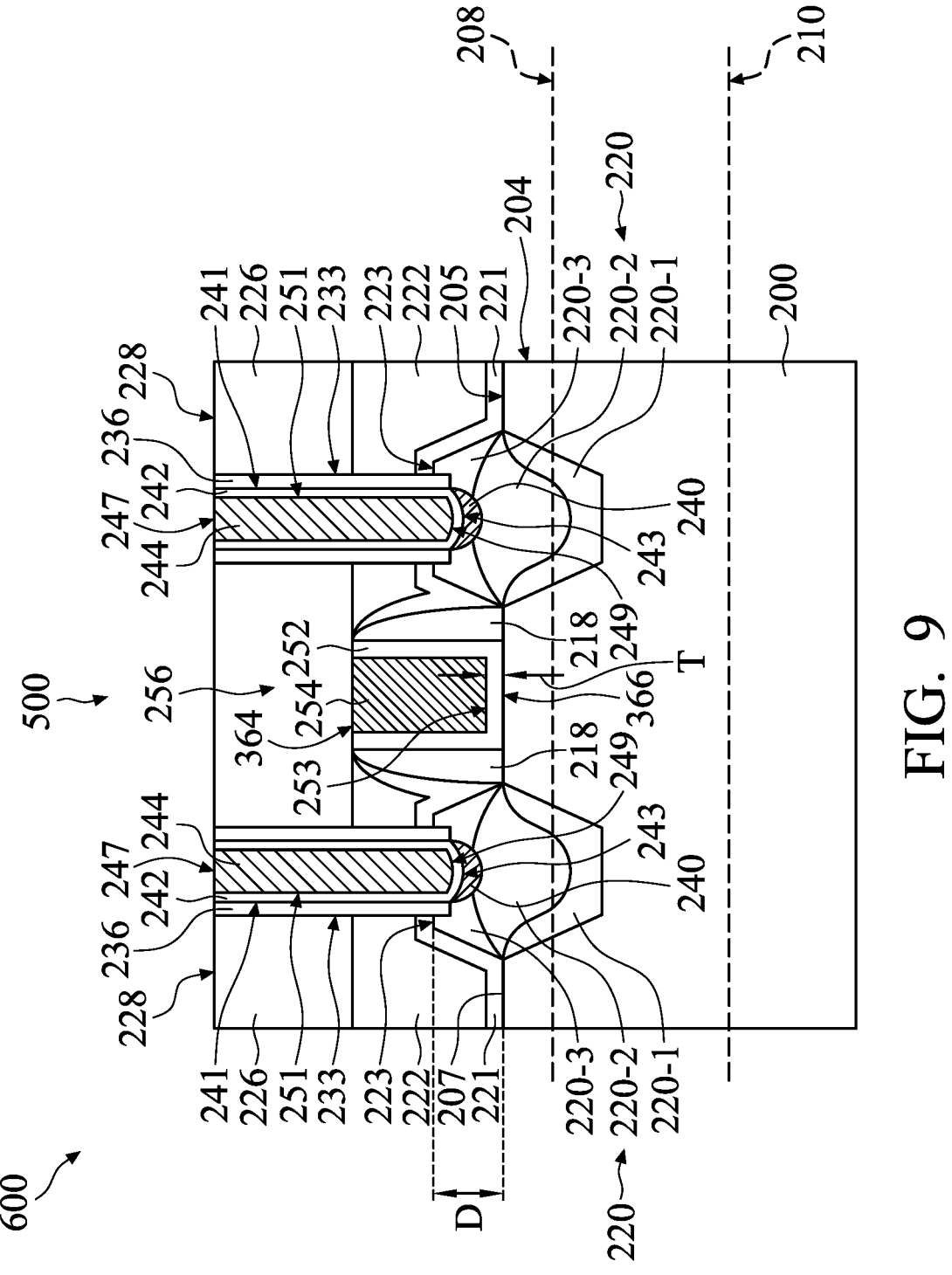

Afterward, glue layers 242 are formed covering the sidewall surfaces 233 of the openings 232 (FIG. 8), as shown in FIG. 9 in accordance with some embodiments. The glue layers 242 are formed covering the source/drain structures 220 in the openings 232 (FIG. 8). In addition, contact structures 244 are formed filling the openings 232 (FIG. 8). The contact structures 244 are formed passing through the dielectric layers 222 and 226.

As shown in FIG. 9, the glue layer 242 may be conformally formed over the source/drain silicide layer 240 and line the sidewall surface 233 and a bottom of each of the openings 232, in accordance with some embodiments. The blocking layers 236 may be positioned encircling sidewall surfaces 241 of the corresponding glue layers 242. In addition, bottom surfaces 243 of the glue layers 242 are respectively exposed to the blocking layers 236. In some embodiments, the bottom surfaces of the blocking layers 236 are higher than the bottom surfaces of the glue layers 242.

In some embodiments, the contact structures 244 are formed over the source/drain structures 220. In some embodiments, the contact structures 244 are formed passing through the dielectric layers 222 and 226. Top surfaces 247 of the contact structures 244 may be leveled with the top surface 228 of the dielectric layer 226. For example, the contact structures 244 may be surrounded by the dielectric layers 222 and 226. In addition, the contact structures 244 may be surrounded by the glue layers 242. In some embodiments, bottom surfaces 249 and sidewall surfaces 251 of the contact structures 244 are covered by the corresponding glue layers 242. Moreover, the contact structures 244 may be electrically connected to the source/drain structures 220 through the glue layers 242 and the source/drain silicide layer 240. As shown in FIG. 9, the contact structures 244 may serve as source/drain contact structures, in accordance with some embodiments.

In some embodiments, the glue layers 242 and the contact structures 244 are formed by deposition processes and a subsequent planarization process such as chemical mechanical polish (CMP). The glue layers 242 may include an electrically conductive material such as titanium (Ti), titanium nitride (TiN), tantalum (Ta), tantalum nitride (TaN), or the like, and may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used. The contact structures 244 may be made of a conductive material, such as copper (Cu), aluminum (Al), tungsten (W), titanium (Ti), titanium nitride (TiN), tantalum (Ta), tantalum nitride (TaN), or another applicable material, and may be formed by any suitable deposition method, such as PVD, CVD, ALD, plating (e.g. electroplating). It should be noted that the glue layers 242 are used to improve adhesion between the underlying layer and the contact structures 244.

As shown in FIG. 9, the blocking layers 236 are positioned between the dielectric layers 222 (or 226) and the glue layers 242, in accordance with some embodiments, Portions of the blocking layers 236, portions of the glue layers 242 and portions of the contact structures 244 may be embedded in the source/drain structures 220. In some embodiments, the bottom surfaces 238 of the blocking layers 236 are positioned between the top surfaces 205 of the fin structures 204 and the top surfaces 223 of the corresponding source/drain structures 220. In addition, the bottom surfaces 238 of the blocking layers 236 may be positioned between the top surfaces 233 of the source/drain structures 220 and the bottom surfaces 243 of the glue layers 242.

After the aforementioned processes have been performed, the FinFETs 500 are formed over the corresponding fin structures 204. Moreover, a semiconductor structure 600 including the FinFETs 500A (e.g. the P-type FinFET) is formed, as shown in FIG. 9 in accordance with some embodiments.

It should be noted that, as shown in FIG. 9, the source/drain structures 220 have the raise height (the distance D) between the top surface 205 of the fin structure 204 and the top surface 223 of the source/drain structures 220, the gate dielectric layer 252 has a thickness T along a direction that is substantially perpendicular to a top surface of the substrate 200, and a ratio of the raised height D to the thickness T of the gate dielectric layer 252 is in a range from about 1 to about 20. When the ratio of the raised height D to the thickness T is too large (e.g. greater than 20), the source/drain structure 220 may be too thick such that the process cost may be increased. When the ratio of the raised height D to the thickness T is too small (e.g. smaller than 1), the current path from the source/drain structure 220 to the channel region of the FINFET may be blocked by the blocking layers 236, and the current crowding problem may occur.

In addition, a bottom surface of the CESL 221 is in contact with the top surface 223 (i.e. the topmost surface) of the source/drain structures 220, and the bottom surface of the CESL 221 is higher than an interface 223 between the gate dielectric layer 252 and the gate electrode layer 254.

In some embodiments, the semiconductor structure 600 includes the source/drain structure 220 and the blocking layer 236. In addition, the side surfaces 320 of the source/drain structure 220 may be "trimmed" by the selective etching process 360 to decrease the width (along the direction of the (110) plane) of source/drain structure 220. The "trimmed" source/drain structure 220 may minimize or prevent electrical short-circuits without limiting FinFET performance. In some embodiments, to compensate for the width reduction of source/drain structure 220, the source/drain structure 220 may have an increased raise height to increase the total volume of each of the source/drain structure 220. The resistance of the source/drain structure 220 can be reduced further.

In some embodiments, the blocking layer 236 of the semiconductor structure 600 may be formed lining sidewall surfaces 233 of the contact hole (e.g., the openings 232) to improve off-state current (Ioff) (leakage current) of the FinFET 500. The bottom surface 238 of the blocking layer 236 is higher than the top surface 205 of the fin structure 204. Because the source/drain structure 220 has an enough raise height (e.g. the distance D) to resist the loss of the fin structure 204 during the etching process of the contact hole, the current path from the source/drain structure to the channel region of the FINFET may not be blocked by the blocking layer 236. Therefore, the current crowding problem may be avoided.

As described previously, the semiconductor structure 600 includes a source/drain structure 220 and a blocking layer 236. The source/drain structure 220 is positioned in the fin structure 204 and adjacent to the gate structure 256. The first source/drain structure 220 includes a first epitaxial layer 220-1 in contact with the top surface 205 of the fin structure 204 and a second epitaxial layer 220-2 over the first epitaxial layer 220-1. The blocking layer 236 is positioned encircling a sidewall surface 241 of the glue layer 242. The source/drain structure 220 has an enough raise height (e.g. the distance D) to resist the loss of the fin structure 204 during the etching process of the blocking layer 236 and the subsequent contact structure 244. Therefore, a bottom surface 238 of the blocking layer 236 is between a top surface 205 of the fin structure 204 and a top surface 233 of the source/drain structure 220. The current path from the source/ drain structure to the channel region of the FINFET may not be blocked by the blocking layer 236. Therefore, the current crowding problem may be avoided.

Embodiments of a semiconductor structure and a method for forming the same are provided. The semiconductor structure includes a gate structure, a first source/drain structure, a contact structure, a glue layer and a blocking layer. The first source/drain structure includes a first epitaxial layer in contact with the top surface of the first fin structure and a second epitaxial layer over the first epitaxial layer. The glue layer is positioned covering a bottom surface and a sidewall surface of the contact structure. The blocking layer is positioned encircling a sidewall surface of the glue layer. A bottom surface of the blocking layer is between a top surface of the first fin structure and a top surface of the first source/drain structure. The resistance of the source/drain structure may be reduced even further. The blocking layer may improve off-state current (Ioff) (leakage current) of the FinFET. The current path from the source/drain structure to the channel region of the FINFET may not be blocked by the blocking layer. Therefore, the current crowding problem may be avoided.

In some embodiments, a semiconductor structure is provided. The semiconductor structure includes a gate structure, a first source/drain structure, and a contact structure. The gate structure has a gate dielectric layer over a first fin structure. The gate dielectric layer has a thickness that is substantially perpendicular to a top surface of the first fin structure. The first source/drain structure is positioned in the first fin structure and adjacent to the gate structure. The first source/drain structure includes a first epitaxial layer in contact with the top surface of the first fin structure and a second epitaxial layer over the first epitaxial layer and extending above a bottom surface of the gate dielectric layer. The contact structure extends into the first source/drain structure. The top surface of the first fin structure is between a top surface and a bottom surface of the first source/drain structure. The first source/drain structure has a raised height between the top surface of the first fin structure and the top surface of the first source/drain structure, and a ratio of the raised height to the thickness of the gate dielectric layer is in a range from about 1 to about 20.

In some embodiments, the semiconductor structure further includes: a glue layer and a blocking layer. The glue layer covers a bottom surface and a sidewall surface of the contact structure. The blocking layer encircles a sidewall surface of the glue layer. A bottom surface of the blocking layer is between the top surface of the first fin structure and the top surface of the first source/drain structure.

In some embodiments, the bottom surface of the blocking layer is between the top surface of the first source/drain structure and a bottom surface of the glue layer.

In some embodiments, the semiconductor structure further includes: a gate spacer on a sidewall of the gate structure, a contact etch stop layer (CESL) over the first source/drain structure and the gate spacer, and a dielectric layer between the CESL and the blocking layer. The dielectric layer surrounds the contact structure, and the blocking layer and the gate spacer are formed of the same material.

In some embodiments, the semiconductor structure further includes: a second fin structure adjacent to the first fin structure, and a second source/drain structure in the second fin structure. The first source/drain structure and the second source/drain structure are positioned along a direction that is substantially perpendicular to the longitudinal direction of the first fin structure and the second fin structure. The first source/drain structure is separated from the second source/ drain structure in a second fin structure adjacent to the first fin structure.

In some embodiments, an angle formed by a pair of side surfaces of the first source/drain structure is in a range from about 55° to about 180°. The pair of side surfaces of the first source/drain structure is positioned on the same side of the first fin structure.

In some embodiments, the first epitaxial layer includes a silicon germanium epitaxial layer with a germanium atomic % in a range from about 0% to about 40%, a boron dopant concentration in a range from about $5\times10^{19}$ atoms/cm$^3$ to about $1\times10^{21}$ atoms/cm$^3$, and a thickness in a range from greater than 0 to about 60 nm.

In some embodiments, the second epitaxial layer includes a silicon germanium epitaxial layer with a germanium atomic % in a range from about 20% to about 80%, a boron dopant concentration in a range from about $1\times10^{20}$ atoms/ cm$^3$ to about $3\times10^{21}$ atoms/cm$^3$, and a thickness in a range from greater than 0 nm to about 60 nm.

In some embodiments, the first source/drain structure includes: a capping epitaxial layer over the second epitaxial layer. The epitaxial capping layer includes a silicon germanium epitaxial layer with a germanium atomic % in a range from about 0% and 40%, a boron dopant concentration in a range from about $5\times10^{19}$ atoms/cm$^3$ to about $1\times10^{21}$ atoms/ cm$^3$, and a thickness in a range from greater than 0 nm to about 15 nm.

In some embodiments, a bottommost point of the epitaxial capping layer is level with a surface of the CESL which interfaces a top surface of the fin structure.

In some embodiments, a semiconductor structure is provided. The semiconductor structure includes: a gate structure over a first fin structure, a source/drain structure in the first fin structure and adjacent to the gate structure, and a contact etch stop layer (CESL) over the source/drain structure. The source/drain structure includes: a first epitaxial layer over the first fin structure, a second epitaxial layer over the first epitaxial layer, and an epitaxial capping layer over the second epitaxial layer. A bottommost point of the epitaxial capping layer is level with a surface of the CESL which interfaces a top surface of the fin structure.

In some embodiments, the semiconductor structure further includes a dielectric layer over the CESL. An opening is formed in the dielectric layer and the epitaxial capping layer without penetrating completely through a thickness of the epitaxial capping layer.

In some embodiments, the semiconductor structure further includes a blocking layer formed in the opening. A bottom surface of the blocking layer is between a top surface and a bottom surface of the epitaxial capping layer.

In some embodiments, the semiconductor structure further includes a contact structure filling the opening. A sidewall surface of the contact structure is surrounded by the blocking layer.

In some embodiments, the semiconductor structure further includes a silicide layer formed in the opening. A bottom surface of the silicide layer is between a top surface of the second epitaxial layer and a top surface of the first fin structure.

In some embodiments, a boron dopant concentration of the source/drain structure is decreased from a center of the source/drain structure to a boundary of the source/drain structure.

In some embodiments, a semiconductor structure is provided. The semiconductor structure includes: a gate structure over a first fin structure, a gate spacer over a sidewall of the gate structure, a source/drain structure in the first fin structure and adjacent to the gate structure, a contact etch stop layer (CESL) over the source/drain structure and the gate spacer, and an inter-layer dielectric (ILD) structure over the CESL. The source/drain structure includes: a first epitaxial layer over the first fin structure, a second epitaxial layer over the first epitaxial layer, and an epitaxial capping layer over the second epitaxial layer. An opening is formed in the ILD structure and the epitaxial capping layer without penetrating completely through a thickness of the epitaxial capping layer.

In some embodiments, the semiconductor structure further includes a blocking layer in the opening. The sidewall of the CESL and the sidewall of the source/drain structure are covered by the blocking layer.

In some embodiments, a bottommost point of the blocking layer is lower than a topmost point of the CESL and higher than a bottommost point of the CESL.

In some embodiments, a bottommost point of the epitaxial capping layer is level with a surface of the CESL which interfaces a top surface of the fin structure and is level with a surface of the gate structure which interfaces the top surface of the fin structure.

In some embodiments, a semiconductor structure is provided. The semiconductor structure includes a gate structure over a fin structure, and a source/drain structure in the fin structure and adjacent to the gate structure. The source/drain structure includes: a first epitaxial layer over the fin structure, a second epitaxial layer over the first epitaxial layer, and an epitaxial capping layer over the second epitaxial layer. The semiconductor structure also includes a silicide layer formed in contact with the source/drain structure. The silicide layer has a curved bottom surface, and the curved bottom surface of the silicide layer intersects with the second epitaxial layer and the epitaxial capping layer.

In some embodiments, the semiconductor structure further includes a dielectric layer over the source/drain structure and a blocking layer formed in the dielectric layer and the epitaxial capping layer without penetrating completely through a thickness of the epitaxial capping layer.

In some embodiments, a bottom end of the blocking layer is between a top surface and a bottom surface of the epitaxial capping layer.

In some embodiments, the semiconductor structure further includes a contact structure. A sidewall surface of the contact structure is surrounded by the blocking layer.

In some embodiments, an interface between the first epitaxial layer and the second epitaxial layer is curved.

In some embodiments, an interface between the second epitaxial layer and the capping epitaxial layer is curved.

In some embodiments, a semiconductor structure is provided. The semiconductor structure includes a gate structure over a fin structure, a gate spacer over a sidewall of the gate structure, and a source/drain structure in the fin structure and adjacent to the gate structure. The source/drain structure includes: a first epitaxial layer over the fin structure, a second epitaxial layer over the first epitaxial layer, and an epitaxial capping layer over the second epitaxial layer. The semiconductor structure further includes an inter-layer dielectric (ILD) structure over the source/drain structure. The semiconductor structure also includes a silicide layer formed on the source/drain structure, and a blocking layer formed in the ILD structure. A top surface of the silicide layer starting from and ending at an inner surface of the blocking layer is a continuously curved surface. The silicide layer is encircled by the inner surface of the blocking layer, and the inner surface is away from a sidewall surface of the ILD structure.

In some embodiments, the second epitaxial layer intersects with the gate spacers.

In some embodiments, the semiconductor structure further includes a glue layer covering a bottom surface and a sidewall surface of the contact structure, wherein the glue layer separates the contact structure from the silicide layer.

In some embodiments, a bottom end of the blocking layer and a bottom end of the gate spacer are located at different heights.

In some embodiments, a semiconductor structure is provided. The semiconductor structure includes a gate structure having a gate dielectric layer over a fin structure, gate spacers formed on the opposite sidewalls of the gate structure and over the fin structure, and a source/drain structure in the fin structure and adjacent to the gate structure. The source/drain structure includes: a first epitaxial layer in contact with the top surface of the fin structure, a second epitaxial layer over the first epitaxial layer, and a capping epitaxial layer over the second epitaxial layer. The semiconductor structure also includes a contact structure extending over the source/drain structure, a blocking layer formed around the contact structure, and a silicide layer formed between the source/drain structure and the contact structure. A top surface and a bottom surface of the silicide layer extend from and end at the blocking layer, the bottom surface of the silicide layer is lower than a bottom end of the blocking layer, and a horizontal plane passes through the bottom surface of the silicide layer and the second epitaxial layer.

In some embodiments, the semiconductor structure further includes a glue layer covering a bottom surface and a sidewall surface of the contact structure. The glue layer separates the contact structure from the silicide layer.

In some embodiments, the glue layer is conformally formed along the sidewall surface of the contact structure and the top surface of the silicide layer.

In some embodiments, the blocking layer and the gate spacers are formed of the same material.

In some embodiments, an interface between the first epitaxial layer and the second epitaxial layer is curved.

In some embodiments, an interface between the second epitaxial layer and the capping epitaxial layer is curved.

In some embodiments, the silicide layer comprises cobalt, titanium, nickel, copper, tungsten, and molybdenum.

In some embodiments, the blocking layer extends into the source/drain structure.

In some embodiments, the first epitaxial layer intersects with the gate spacers.

In some embodiments, the bottom end of the blocking layer and a bottom end of the gate spacers are located at different heights.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a gate structure having a gate dielectric layer over a fin structure;
gate spacers formed on opposite sidewalls of the gate structure and over the fin structure;
a source/drain structure in the fin structure and adjacent to the gate structure, wherein the source/drain structure comprises:
a first epitaxial layer in contact with a top surface of the fin structure;
a second epitaxial layer over the first epitaxial layer; and
a capping epitaxial layer over the second epitaxial layer;
a contact structure extending over the source/drain structure;
a blocking layer formed around the contact structure;
a glue layer covering a bottom surface and a sidewall surface of the contact structure; and
a silicide layer formed between the source/drain structure and the contact structure, wherein a top surface and a bottom surface of the silicide layer extend from and end at an interface between the glue layer and the blocking layer, the bottom surface of the silicide layer is lower than a bottom end of the blocking layer, and a horizontal plane passes through the bottom surface of the silicide layer and the second epitaxial layer,
wherein the top surface of the silicide layer is a curved interface between the glue layer and the silicide layer, and the bottom surface of the silicide layer is a curved surface in contact with the second epitaxial layer and the capping epitaxial layer.

2. The semiconductor structure as claimed in claim 1, wherein the glue layer separates the contact structure from the silicide layer.

3. The semiconductor structure as claimed in claim 2, wherein the glue layer is conformally formed along the sidewall surface of the contact structure and the top surface of the silicide layer.

4. The semiconductor structure as claimed in claim 1, wherein the blocking layer and the gate spacers are formed of the same material.

5. The semiconductor structure as claimed in claim 1, wherein an interface between the first epitaxial layer and the second epitaxial layer is curved.

6. The semiconductor structure as claimed in claim 1, wherein an interface between the second epitaxial layer and the capping epitaxial layer is curved.

7. The semiconductor structure as claimed in claim 1, wherein the silicide layer comprises cobalt, titanium, nickel, copper, tungsten, and molybdenum.

8. The semiconductor structure as claimed in claim 1, wherein the blocking layer extends into the source/drain structure.

9. The semiconductor structure as claimed in claim 1, wherein the first epitaxial layer intersects with the gate spacers.

10. The semiconductor structure as claimed in claim 1, wherein the bottom end of the blocking layer and a bottom end of the gate spacers are located at different heights.

11. A semiconductor structure, comprising:
a gate structure over a fin structure;
a source/drain structure in the fin structure and adjacent to the gate structure, wherein the source/drain structure comprises:
a first epitaxial layer in contact with a top surface of the fin structure;
a second epitaxial layer over the first epitaxial layer; and
a capping epitaxial layer over the second epitaxial layer;
a dielectric layer over the source/drain structure and the gate structure;
a blocking layer penetrating the dielectric layer and connected to the source/drain structure;
a glue layer covering a bottom surface and a sidewall surface of the contact structure; and
a silicide layer surrounded by the blocking layer, wherein a top surface and a bottom surface of the silicide layer extend from and end at an interface between the glue layer and the blocking layer, the bottom surface of the silicide layer is lower than a bottom end of the blocking layer, and a horizontal plane passes through the bottom surface of the silicide layer and the second epitaxial layer,
wherein the top surface of the silicide layer is a curved interface between the glue layer and the silicide layer, and the bottom surface of the silicide layer is a curved surface in contact with the second epitaxial layer and the capping epitaxial layer.

12. The semiconductor structure as claimed in claim 11, wherein a curvature of the top surface of the silicide layer is different from a curvature of the bottom surface of the silicide layer.

13. The semiconductor structure as claimed in claim 11, wherein the top surface of the silicide layer is lower than the bottom end of the blocking layer, and a horizontal plane passes through the top surface of the silicide layer and the capping epitaxial layer.

14. The semiconductor structure as claimed in claim 11, wherein a thickness of the silicide layer gradually increases from an edge of the silicide layer to a center of the silicide layer.

15. The semiconductor structure as claimed in claim 11, wherein the silicide layer is adjacent to the blocking layer when viewed in a direction perpendicular to the horizontal plane.

16. A semiconductor structure, comprising:
a gate structure having a gate dielectric layer and a gate electrode layer over a fin structure;

a source/drain structure in the fin structure and adjacent to the gate structure, wherein the source/drain structure comprises:

a first epitaxial layer in contact with a top surface of the fin structure;

a second epitaxial layer over the first epitaxial layer; and a capping epitaxial layer over the second epitaxial layer;

a contact structure extending over the source/drain structure;

a blocking layer formed around the contact structure;

a glue layer covering a bottom surface and a sidewall surface of the contact structure; and a silicide layer, wherein a top surface and a bottom surface of the silicide layer extend from and end at an interface between the glue layer and the blocking layer, the bottom surface of the silicide layer is lower than a bottom end of the blocking layer, a horizontal plane passes through the bottom surface of the silicide layer and the second epitaxial layer, and the silicide layer overlaps with the contact structure in a direction perpendicular to the horizontal plane, wherein the top surface of the silicide layer is a curved interface between the glue layer and the silicide layer, and the bottom surface of the silicide layer is a curved surface in contact with the second epitaxial layer and the capping epitaxial layer.

17. The semiconductor structure as claimed in claim 16, wherein the silicide layer is located between a top surface and a bottom surface of the gate structure in the direction perpendicular to the horizontal plane.

18. The semiconductor structure as claimed in claim 16, wherein a bottom surface of the glue layer is lower than the bottom end of the blocking layer.

19. The semiconductor structure as claimed in claim 18, wherein the glue layer separates the contact structure from the blocking layer.

20. The semiconductor structure as claimed in claim 18, wherein the glue layer contacts the top surface of the silicide layer and the bottom end of the blocking layer.

* * * * *